US006877992B2

(12) United States Patent
Grant et al.

(10) Patent No.: US 6,877,992 B2
(45) Date of Patent: Apr. 12, 2005

(54) AREA ARRAY CONNECTOR HAVING STACKED CONTACTS FOR IMPROVED CURRENT CARRYING CAPACITY

(75) Inventors: John L. Grant, Sherborn, MA (US); Michael P. Cuff, Georgetown, TX (US)

(73) Assignee: Airborn, Inc., Addison, TX (US)

( * ) Notice: Subject to any disclaimer, the term of this patent is extended or adjusted under 35 U.S.C. 154(b) by 47 days.

(21) Appl. No.: 10/285,777

(22) Filed: Nov. 1, 2002

(65) Prior Publication Data

US 2004/0087189 A1 May 6, 2004

(51) Int. Cl.[7] .......................... H01R 12/00; H05K 1/00
(52) U.S. Cl. .......................... 439/66; 439/91; 439/591
(58) Field of Search .......................... 439/91, 591, 66, 439/71–73

(56) References Cited

U.S. PATENT DOCUMENTS

| | | | | | |
|---|---|---|---|---|---|
| 4,199,209 | A | | 4/1980 | Cherian et al. | 339/59 M |
| 4,998,886 | A | * | 3/1991 | Werner | 439/66 |
| 5,007,842 | A | | 4/1991 | Deak et al. | 439/66 |
| 5,030,109 | A | | 7/1991 | Dery | 439/66 |
| 5,069,629 | A | * | 12/1991 | Johnson | 439/71 |
| 5,148,265 | A | | 9/1992 | Khandros et al. | 357/80 |
| 5,203,813 | A | | 4/1993 | Fitzsimmons et al. | 29/876 |
| 5,232,372 | A | | 8/1993 | Bradley et al. | 439/66 |
| 5,324,205 | A | | 6/1994 | Ahmad et al. | 439/66 |
| 5,334,804 | A | | 8/1994 | Love et al. | 174/267 |
| 5,367,764 | A | | 11/1994 | DiStefano et al. | 29/830 |
| 5,466,161 | A | | 11/1995 | Yumibe et al. | 439/66 |
| 5,498,166 | A | * | 3/1996 | Rothenberger | 439/66 |
| 5,531,022 | A | * | 7/1996 | Beaman et al. | 29/850 |
| 5,536,362 | A | | 7/1996 | Love et al. | 156/643.1 |
| 5,570,504 | A | | 11/1996 | DiStefano et al. | 29/830 |
| 5,876,219 | A | | 3/1999 | Taylor et al. | 439/74 |
| 5,892,216 | A | | 4/1999 | Grant et al. | 235/492 |
| 5,921,787 | A | | 7/1999 | Pope et al. | 439/74 |
| 6,077,089 | A | | 6/2000 | Bishop et al. | 439/66 |
| 6,155,887 | A | | 12/2000 | Cuff et al. | 439/751 |
| 6,200,141 | B1 | | 3/2001 | Sinclair | 439/66 |
| 6,203,329 | B1 | * | 3/2001 | Johnson et al. | 439/66 |
| 6,220,869 | B1 | | 4/2001 | Grant et al. | 439/66 |
| 6,273,731 | B1 | | 8/2001 | Bishop et al. | 439/66 |
| 6,308,889 | B1 | | 10/2001 | Grant et al. | 235/441 |
| 6,318,632 | B1 | | 11/2001 | Grant et al. | 235/441 |
| 6,343,940 | B1 | | 2/2002 | Khoury et al. | 439/66 |

* cited by examiner

*Primary Examiner*—Hae Moon Hyeon
(74) *Attorney, Agent, or Firm*—Jenkens & Gilchrist, P.C.

(57) ABSTRACT

An area array connector adapted to connect contact pads on a first generally planar circuit element to corresponding contact pads on a second generally planar circuit element is described. The area array connector includes an interposer housing and at least one electrical interconnector positioned within the interposer housing. The at least one electrical interconnector is comprised of a plurality of electrical contacts stacked in a substantially parallel relationship to one another. The at least one electrical interconnector is positioned to make contact with a first contact pad on the first generally planar circuit element and a second contact pad on the second generally planar circuit element to provide an electrical interconnection therebetween.

20 Claims, 6 Drawing Sheets

AREA ARRAY CONNECTOR HAVING STACKED CONTACTS FOR IMPROVED CURRENT CARRYING CAPACITY

BACKGROUND OF THE INVENTION

1. Technical Field of the Invention

The present invention is generally directed to area array connectors adapted to connect the contact pads of one generally planar circuit element, such as a printed circuit board, to corresponding contact pads on another generally planar circuit element.

2. Description of Related Art

In many electronic applications, compactness of the electronic assembly is an important goal. One manner of achieving this compactness is to stack circuit cards, such as printed circuit boards, one upon another, and electrically connecting the circuit cards together.

In order to make use of such a compact arrangement, it is necessary that the face-to-face connection of circuit cards be made assuredly both electrically and mechanically. Interposers, such as area array connectors, are often used to connect corresponding contact pads on adjacent circuit cards for this purpose.

An important component of many interposer designs for electrically connecting circuit cards is that of providing power interconnection. In some conventional interposer designs power interconnection is provided through separate, large, discrete power contacts that have to be physically separated from the interposer. In other conventional interposer designs, a number of single electrical contacts are scattered around the interposer and connected electrically in parallel via the power and ground plane circuitry on the circuit card. This interposer design wastes a large amount of valuable circuit card area and creates a problem with what is commonly called “current sharing”, i.e., the need to split the current nearly equally between all of the parallel electrical contacts.

SUMMARY OF THE INVENTION

One aspect of the present invention is generally directed to an area array connector adapted to connect contact pads on a first generally planar circuit element to corresponding contact pads on a second generally planar circuit element. The area array connector includes an interposer housing and at least one electrical interconnector positioned within the interposer housing. The at least one electrical interconnector is comprised of a plurality of electrical contacts stacked in a substantially parallel relationship to one another. The at least one electrical interconnector is positioned to make contact with a first contact pad on the first generally planar circuit element and a second contact pad on the second generally planar circuit element to provide an electrical interconnection therebetween.

Another aspect of the present invention is directed to an assembly including a plurality of generally planar circuit elements having contact elements on at least one surface thereof, and at least one area array connector. The circuit elements are stacked upon one another with the at least one area array connector interleaved therebetween. The at least one area array connector includes an interposer housing, and at least one electrical interconnector positioned within the interposer housing. The at least one electrical interconnector is comprised of a plurality of electrical contacts stacked in a substantially parallel relationship to one another. The electrical interconnector is positioned to make contact with a first contact pad on one of the plurality of generally planar circuit elements and a second contact pad on another of the plurality of generally planar circuit elements to provide an electrical interconnection therebetween.

The area array connector of the present invention provides several advantages over conventional interposer designs. First, the area array connector of the present invention provides for an interposer style interconnection system between circuit cards that is capable of carrying both low current signal interconnectors as well as much higher current power interconnectors in a single integrated interposer housing. In addition, the same form of electrical contact can be used for both signal interconnectors and power interconnectors within the area array connector, as a single electrical contact can be used as a signal interconnector, and a number of stacked electrical contacts can be used to form a power interconnector. The integration of signal interconnectors and power interconnectors into a single interposer design provides for lower system cost compared to conventional interposer designs, which generally use separate large, bulky power contacts that are physically separated from the interposer in order to provide power interconnection between circuit cards.

Another advantage of the area array connector of the present invention is that power interconnectors having any required current carrying capacity can be obtained simply by stacking the appropriate number of electrical contacts side-by-side in an appropriately sized aperture in the area array connector. The fact that each individual electrical contact is thin and flat allows for many electrical contacts to be stacked side-by-side in a small area. In contrast, conventional power contacts require the production of a differently sized contact for each incremental increase in required current, leading to expensive retooling costs for the production of the new power contact size.

An additional advantage of using multiple electrical contacts to form a power interconnector in accordance with the principles of the present invention is that the each electrical contact makes a separate and independent connection with the power contact pad on the circuit card. As a result, the reliability of the power interconnector is increased due to the presence of redundant connections. In addition, the total contact resistance of the power interconnector is decreased due to the presence of multiple parallel electrical paths between the contact tips of the electrical connectors and the power contact pads on the circuit card, resulting in improved electrical performance.

BRIEF DESCRIPTION OF THE DRAWINGS

For a more complete understanding of the present invention, reference is made to the following detailed description taken in conjunction with the accompanying drawings wherein.

DETAILED DESCRIPTION OF THE INVENTION

Figure 1:
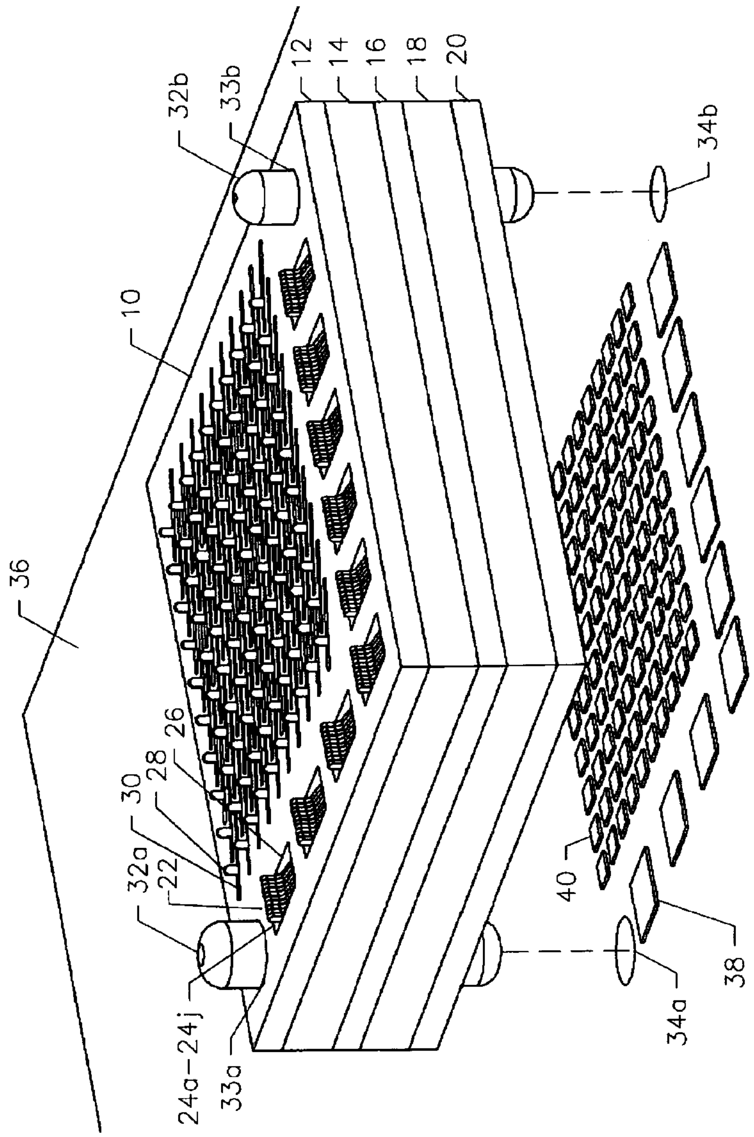
FIG. 1 is a perspective view of an area array connector and a circuit card in accordance with the present invention.

Reference is now made to the Drawings wherein like reference characters denote like or similar parts throughout the various Figures. Referring now to FIG. 1, a perspective view of an area array connector, generally designated as 10, in accordance with the present invention is illustrated. The area array connector 10 includes an interposer housing comprised of a number of generally planar laminated layers, for example five generally planar laminated layers. In an embodiment of the present invention, the first laminated layer 12, second laminated layer 14, third laminated layer 16, fourth laminated layer 18, and fifth laminated layer 20 are constructed of insulative materials such as plastics, ceramics, epoxy with glass filler, etc. The laminated layers 12, 14, 16, 18, and 20 are secured to one another using various suitable means, such as an adhesive.

In accordance with the principles of the present invention, at least one power interconnector 22, comprised of a number of electrical contacts 24*a*–24*j* stacked substantially in parallel to one another, is affixed within a first aperture 26 of the area array connector 10. Although the power interconnector 22 of FIG. 1 is illustrated as being comprised of ten stacked electrical contacts 24*a*–24*j*, the number of stacked electrical contacts can be varied. For example, in accordance with the current requirements of the power interconnector 22, the number can be increased or decreased. For example, if a greater amount of current is required the number of electrical contacts used can be increased. The area array connector 10 can also include one or more signal interconnectors 28 affixed within respective slots 30 of the area array connector 10.

The area array connector 10 further includes alignment posts 32*a* and 32*b* arranged to mate with alignment holes 34*a* and 34*b* in a circuit card 36, such as a printed circuit board, such that the outer surface of an outer laminated layer, in this case the fifth laminated layer 20, is in contact with the surface of the circuit card 36. Upon mating of the area array connector 10 with the circuit card 36, the exposed contact legs of the stacked electrical contacts 24*a*–24*j* are positioned to make contact with power contact pads 38 on the surface of the circuit card 36. If present, the exposed contact legs of the signal interconnectors 28 are positioned to make contact with signal contact pads 40 on the surface of the circuit card 36.

In a complete assembly, another circuit card (not shown), having alignment holes 34*a*, 34*b*, power contact pads 38, and signal contact pads 40 on its surface corresponding to those of the circuit card 36, is mated to the outer surface of the first laminated layer 12. As a result, the area array connector 10 is sandwiched between the two circuit cards, and acts as an interposer to provide electrical power connections between corresponding power contact pads 38 of the circuit cards, and electrical signal connections between corresponding signal contact pads 40 of the circuit cards.

Although the area array connector 10 of FIG. 1 is illustrated as having nine power interconnectors 22 and one hundred signal interconnectors 28, it should be understood that the number of power interconnectors 22 and signal interconnectors 28 can be varied in accordance with the requirements of the circuit cards to be interconnected.

Figure 2:
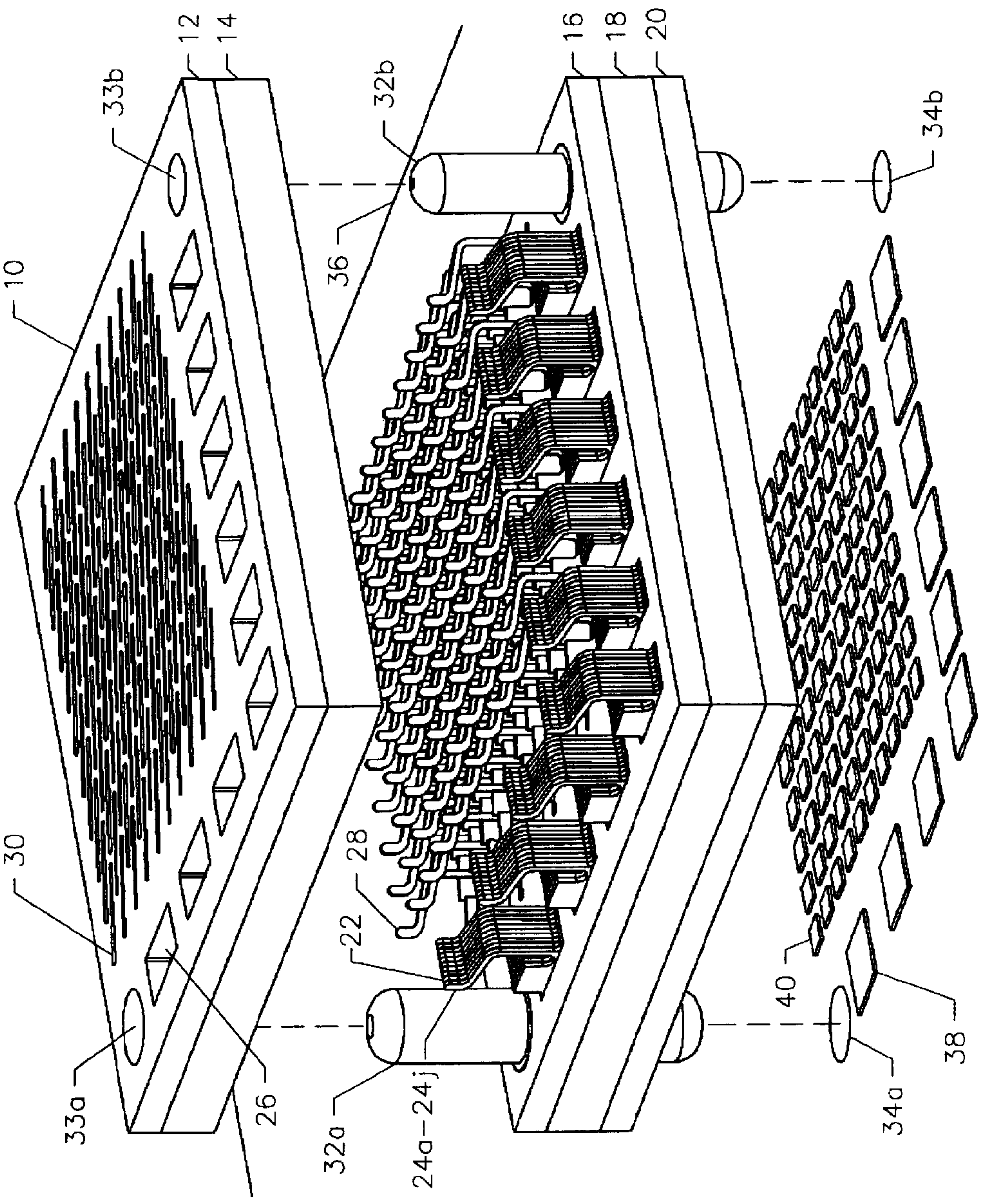
FIG. 2 is an exploded view of the area array connector of FIG. 1.

Referring now to FIG. 2, an exploded view of the area array connector 10 of FIG. 1 is illustrated. Corresponding parts in FIG. 1 and FIG. 2 are given the same reference characters. In the exploded view of FIG. 2, the first laminated layer 12 and second laminated layer 14 have been moved upward in order to provide a clearer view of the individual stacked electrical contacts 24*a*–24*j* of the power interconnector 22 and the signal interconnector 28 within the area array connector 10 structure.

Figure 3:
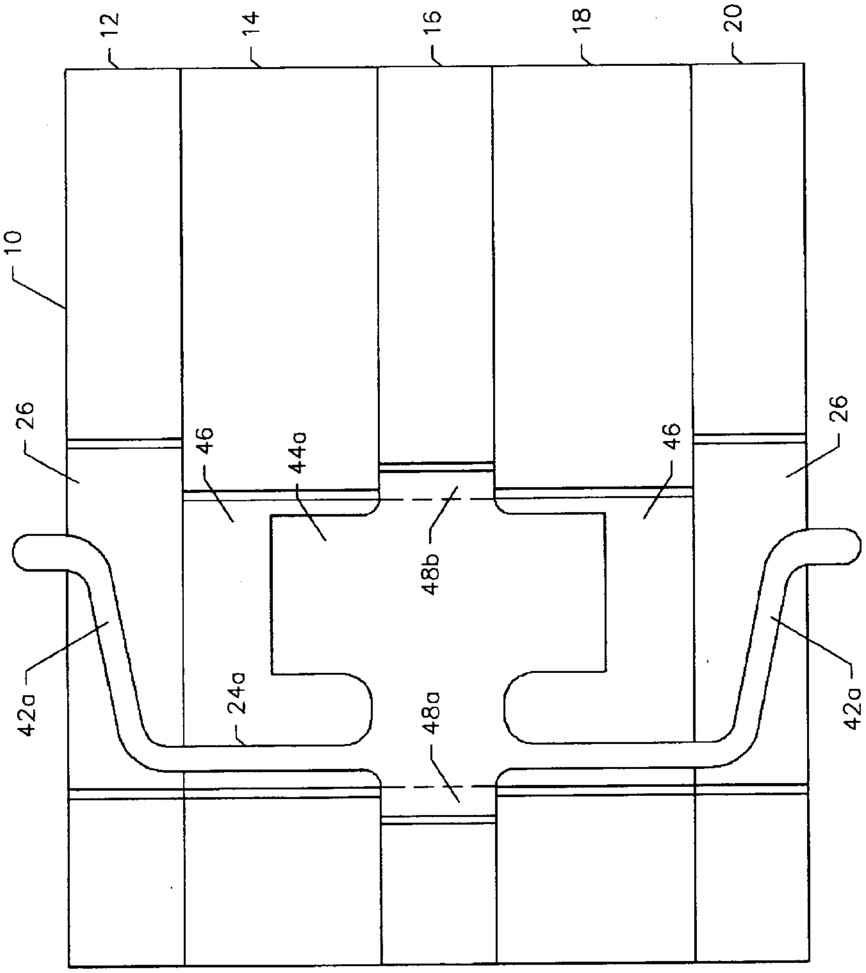
FIG. 3 is partial sectional view through the area array connector of FIG. 1 at the location of a power interconnector.

Referring now to FIG. 3, a partial sectional view through the area array connector 10 of FIG. 1 at the location of a power interconnector 22 is illustrated. The first laminated layer 12 and fifth laminated layer 20 each include the first aperture 26 to accommodate contact legs 42*a* of the stacked electrical contact 24*a*. In addition, the second laminated layer 14 and fourth laminated layer 18 include a second aperture 46 to accommodate a base leg 44*a* of the stacked electrical contact 24*a*. The base leg 44*a* of the stacked electrical contact 24*a* further includes a first tab 48*a* and a second tab 48*b* positioned in contact with the second laminated layer 14, third laminated layer 16, and fourth laminated layer 18 in order to securely affix the electrical contact 24*a* within the area array connector 10.

Figure 4B:
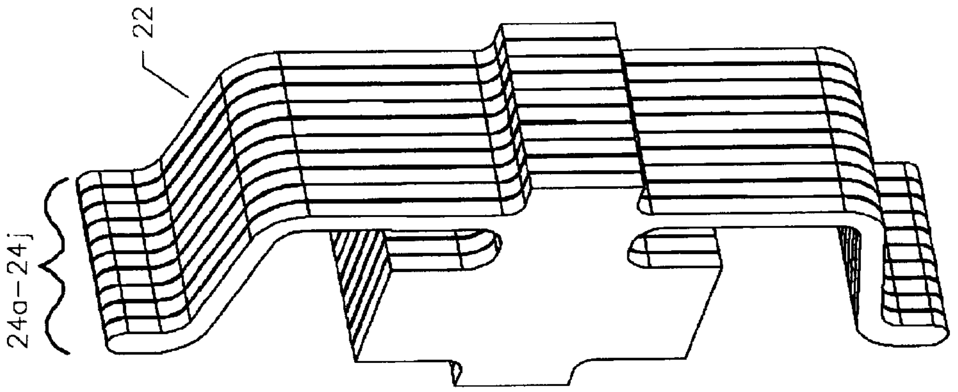
FIG. 4B is a power interconnector of the area array connector of FIG. 1.
Figure 4A:
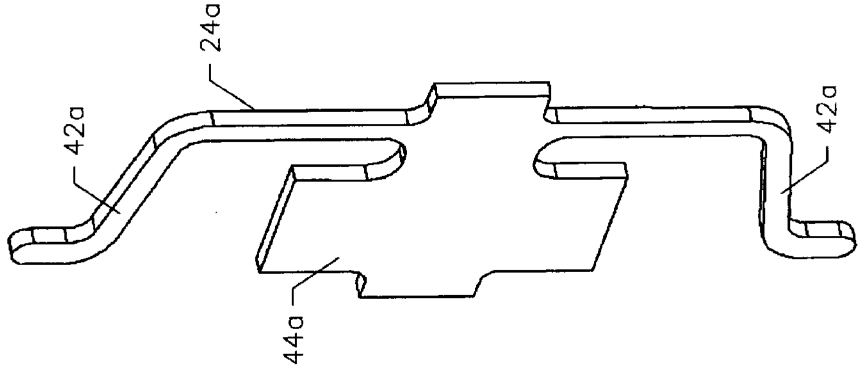
FIG. 4A is an electrical contact of the area array connector of FIG. 1.

Referring now to FIGS. 4A & 4B, an electrical contact 24*a* and a power interconnector 22 in accordance with the present invention is illustrated. As described in relation to FIG. 3, the electrical contact 24*a* of FIG. 4A includes a base leg 44*a* and a pair of contact legs 42*a*. FIG. 4B illustrates a substantially parallel stacking of a number of electrical contacts 24*a*–24*j* to form a single power interconnector 22.

Figure 5:
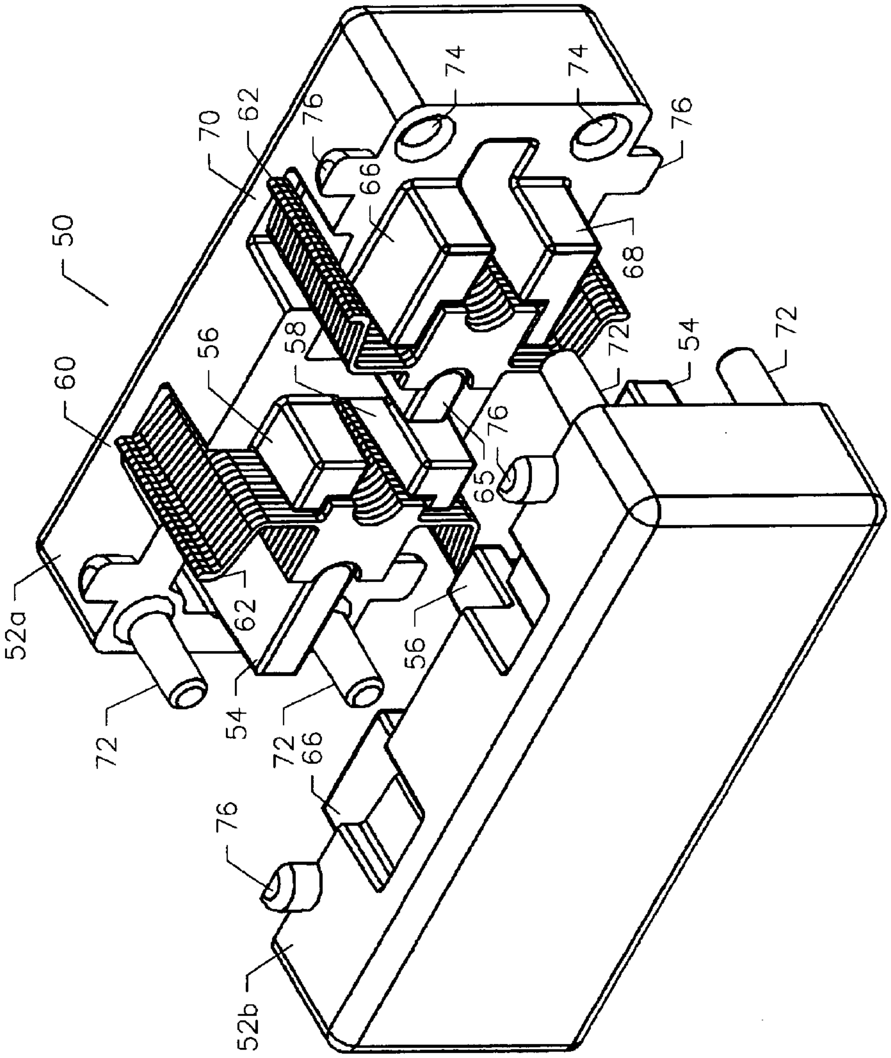
FIG. 5 is a an exploded view of an area array connector, in accordance with an alternate embodiment of the present invention.

Referring now to FIG. 5, an exploded view of an area array connector, generally designated as 50, in accordance with an alternate embodiment of the present invention is illustrated. The area array connector 50 includes an interposer housing comprised of a first molded housing half 52*a* and a second molded housing half 52*b*. In the embodiment illustrated in FIG. 5, the first molded housing half 52*a* and the second molded housing half 52*b* are substantially identical, with the second molded housing half 52*b* being rotated by 180 degrees with respect to the first molded housing half 52*a* during assembly. The first molded housing half 52*a* and the second molded housing half 52*b* each include a first substantially rectangular portion 54 having a curved edge, a first substantially L-shaped portion 56, and a second substantially L-shaped portion 58 adapted to affix a number of electrical contacts 62 to form a first power interconnector 60 within the area array connector 50 when the first molded mousing half 52*a* is mated with the corresponding second molded housing half 52*b* during assembly.

The first molded housing half 52*a* and second molded housing half 52*b* each further include a second substantially rectangular portion 65 having a curved edge, a third substantially L-shaped portion 66, and a fourth substantially L-shaped portion 68 adapted to affix a number of electrical contacts 62 to form a second power interconnector 70 within the area array connector 50 when the first molded mousing half 52*a* is mated with the corresponding second molded housing half 52*b* during assembly. The first molded mousing half 52*a* and the second molded housing half 52*b* each include a pair of pins 72 adapted to fit within corresponding holes 74 to facilitate the assembly of the area array connector 50.

The first molded housing half 52*a* and the second molded housing half each include alignment post halves 76, in this case four, that form alignment posts when the first molded housing half 52*a* and the second molded housing half are mated together during assembly. The four alignment posts are arranged to mate with alignment holes in first and second circuit cards (not shown), such that the area array connector 50 is interleaved as an interposer between the first and second circuit cards.

Upon mating of the area array connector 50 with the first and second circuit cards, exposed tips of contact legs 64 (FIG. 6) of a number of stacked electrical contacts 62 (forming a power interconnector 60) are positioned to make contact with a first power contact pad on the surface of each of the first and second circuit cards, thus providing an electrical interconnection between the corresponding first power contact pads. Similarly, a second power interconnector 70, comprised of a number of stack electrical contacts 62, is arranged to make contact with a second power contact pad on each of the first and second circuit card to provide an interconnection of the second power contact pads on each of the first and second circuit cards.

Figure 6:
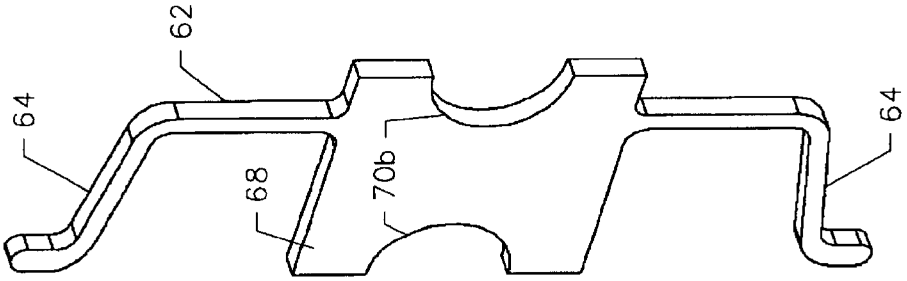
FIG. 6 is a single electrical contact of a power interconnector of the area array connector of FIG. 5.

Referring now to FIG. 6, a single electrical contact 62 of the power interconnectors 60, 70 of FIG. 5 is illustrated. The electrical contact 62 of FIG. 6 includes a base leg 68 and a pair of contact legs 64. The base leg 68 further includes two curved portions 70*a* and 70*b* adapted to engage either the curved portion of the first substantially rectangular portion 54, or the curved portion of the second substantially rectangular portion 65 in order to securely affix the electrical contact 62 within the area array connector 50. As illustrated in FIG. 5, a number of the electrical contacts 62 are stacked together substantially in parallel to form each of the power interconnectors 60, 70.

Although the foregoing discussion describes the use of an area array connector for interconnection between circuit cards, the principles of the present invention can be equally applied for the interconnection of any circuit elements. For example, the area array connector can be used to connect directly with the pads of an integrated circuit package in order to interconnect the integrated circuit package to another circuit element. In addition, the area connector can be used to interconnect a multichip module, typically consisting of a ceramic substrate with multiple integrated circuits attached to one side and contact pads on the other side, to another circuit element.

Although the foregoing discussion describes the stacking of electrical contacts to form a power interconnector within an area array connector, the principles of the present invention can be equally applied to form interconnectors for any signal having a high current requirement. For example, a sandwich arrangement or a side-by-side arrangement is possible. In addition, an electrical connection comprised of stacked electrical contacts in accordance with the principles of the present invention can be used to facilitate the transmission of any signal of high current.

Although a preferred embodiment of the method and apparatus of the present invention has been illustrated in the accompanying Drawings and described in the foregoing Detailed Description, it is understood that the invention is not limited to the embodiment disclosed, but is capable of numerous rearrangements, modifications, and substitutions without departing from the spirit of the invention as set forth and defined by the following claims.

What is claimed is:

1. An area array connector adapted to connect contact pads on a first generally planar circuit element to corresponding contact pads on a second generally planar circuit element, the area array connector comprising:

an interposer housing; and at least one electrical interconnector positioned within the interposer housing, the at least one electrical interconnector comprised of a plurality of electrical contacts stacked in a substantially parallel relationship to one another, the at least one electrical interconnector positioned to make contact with a first contact pad on the first generally planar circuit element and a second contact pad on the second generally planar circuit element to provide an electrical interconnection therebetween.

2. The area array connector of claim 1, wherein the at least one electrical interconnector is a power interconnector.

3. The area array connector of claim 1, further comprising:

at least one signal interconnector positioned within the interposer housing, the at least one signal interconnector positioned to make contact with a first signal contact pad on the first generally planar circuit element and a second signal contact pad on the second generally planar circuit element to provide an electrical interconnection therebetween.

4. The area array connector of claim 1, wherein the interposer housing comprises at least one insulative layer.

5. The area array connector of claim 4, wherein the at least one insulative layer comprises a plurality of laminated layers.

6. The area array connector of claim 1, wherein the interposer housing comprises a first molded housing half and a second molded housing half.

7. The area array connector of claim 1, wherein at least one of the first generally planar circuit element and the second generally planar circuit element comprises a circuit card.

8. The area array connector of claim 1, wherein at least one of the first generally planar circuit element and the second generally planar circuit element comprises a printed circuit board.

9. The area array connector of claim 1, wherein at least one of the first generally planar circuit element and the second generally planar circuit element comprises an integrated circuit.

10. The area array connector of claim 1, wherein at least one of the first generally planar circuit element and the second generally planar circuit element comprises a multichip module.

11. An assembly comprising:

a plurality of generally planar circuit elements having contact elements on at least one surface thereof; and at least one area array connector, the circuit elements being stacked upon one another with the at least one area array connector interleaved therebetween, the at least one area array connector comprising:

an interposer housing; and at least one electrical interconnector positioned within the interposer housing, the at least one electrical interconnector comprised of a plurality of electrical contacts stacked in a substantially parallel relationship to one another, the electrical interconnector positioned to make contact with a first contact pad on one of the plurality of generally planar circuit elements and a second contact pad on another of the plurality of generally planar circuit elements to provide an electrical interconnection therebetween.

12. The assembly of claim 11, wherein the at least one electrical interconnector is a power interconnector.

13. The assembly of claim 11, wherein the at least one area array connector further comprises at least one signal interconnector positioned within the interposer housing, the at least one signal interconnector positioned to make contact with a first signal contact pad on one of the plurality of generally planar circuit element and a second signal contact pad on another of the plurality of generally planar circuit elements to provide an electrical interconnection therebetween.

14. The assembly of claim 11, wherein the interposer housing comprises at least one insulative layer.

15. The assembly of claim 14, wherein the at least one insulative layer comprises a plurality of laminated layers.

16. The assembly of claim 11, wherein the interposer housing comprises a first molded housing half and a second molded housing half.

17. The assembly of claim 11, wherein at least one of the plurality of generally planar circuit elements comprises a circuit card.

18. The assembly of claim 11, wherein at least one of the plurality of generally planar circuit elements comprises a printed circuit board.

19. The assembly of claim 11, wherein at least one of the plurality of generally planar circuit elements comprises an integrated circuit.

20. The assembly of claim 11, wherein at least one of the plurality of generally planar circuit elements comprises a multichip module.

* * * * *